(12) United States Patent
Wang et al.

(10) Patent No.: US 9,150,108 B2
(45) Date of Patent: Oct. 6, 2015

(54) HIGH-FREQUENCY SIGNAL INJECTION BASED HIGH VOLTAGE INTERLOCK

(75) Inventors: Chang-Jiang Wang, Troy, MI (US); Michael W. Degner, Novi, MI (US); Ji Wu, Ann Arbor, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 772 days.

(21) Appl. No.: 13/448,343

(22) Filed: Apr. 16, 2012

(65) Prior Publication Data

US 2013/0270974 A1   Oct. 17, 2013

(51) Int. Cl.
| | |
|---|---|
| *F16P 3/20* | (2006.01) |
| *B60L 3/00* | (2006.01) |
| *G01R 31/02* | (2006.01) |
| *B60L 3/04* | (2006.01) |
| *B60L 11/18* | (2006.01) |
| *B60L 15/20* | (2006.01) |

(52) U.S. Cl.
CPC ............ *B60L 3/0069* (2013.01); *B60L 3/04* (2013.01); *B60L 11/1803* (2013.01); *B60L 15/20* (2013.01); *G01R 31/026* (2013.01); *B60L 2220/14* (2013.01); *B60L 2240/421* (2013.01); *B60L 2240/423* (2013.01); *B60L 2250/10* (2013.01); *B60L 2270/142* (2013.01); *B60L 2270/145* (2013.01); *Y02T 10/642* (2013.01); *Y02T 10/7005* (2013.01); *Y02T 10/7275* (2013.01)

(58) Field of Classification Search
USPC .......................................................... 307/328
See application file for complete search history.

(56) References Cited

U.S. PATENT DOCUMENTS

| | | | | |
|---|---|---|---|---|
| 6,163,127 | A * | 12/2000 | Patel et al. ..................... | 318/700 |
| 6,429,616 | B1 * | 8/2002 | Myers et al. .................. | 318/459 |
| 2009/0118916 | A1 | 5/2009 | Kothari | |
| 2011/0010126 | A1 * | 1/2011 | Xiang et al. .................. | 702/117 |
| 2013/0141028 | A1 * | 6/2013 | Fujiwara et al. .............. | 318/434 |
| 2014/0002011 | A1 * | 1/2014 | Ang et al. ..................... | 320/107 |

OTHER PUBLICATIONS

Chan-Hee Choi; Compensation of Zero-Current Clamping Effects in High-Frequency Injection-Based Sensorless PM Motor Drives; Sep. 24, 2007. http://ieeexplore.ieee.org/Xplore/login. jsp?url=http%3A%2F%2Fieeexplore.ieee. org%2Fiel5%2F28%2F4305307%2F04305310. pdf%3Farnumber%3D4305310&authDecision=-203. (Abstract).

* cited by examiner

*Primary Examiner* — Jared Fureman
*Assistant Examiner* — Duc M Pham
(74) *Attorney, Agent, or Firm* — Maristyn Law LLC; Lynda F. Kouroupis; David B. Kelley (57) ABSTRACT

Systems, methods and apparatus are presented to determine high voltage cable connectivity between an inverter module and a remote electric machine. A high frequency (HF) interlock module can be configured to inject a high frequency excitation signal that can be superimposed on inverter drive signals. High frequency current components can be determined and used to determine connectivity status. The sum and difference of positive and negative sequence component values can be compared to predetermined limitations to detect one or more open phases. An example method can include enabling a HF detection strategy under predetermined conditions. In response to an open phase detection a fault flag can be set.

19 Claims, 9 Drawing Sheets

HIGH-FREQUENCY SIGNAL INJECTION BASED HIGH VOLTAGE INTERLOCK

BACKGROUND OF INVENTION

1. Field of Invention

This invention relates generally to generally to methods and apparatus for high voltage cable connectivity, and more particularly to electronic methods for high voltage interlock.

2. Background Art

Electric (EV) or hybrid electric vehicles (HEV), can employ electrical energy for propulsion via an electric drive system that can include a power conversion circuit coupled to an electric machine, such as an electric motor. In this arrangement, the power conversion circuit can controllably transfer power from a power source, such as a high voltage battery, to the motor to drive a load. In many cases, the power conversion circuit is integrated with the vehicle transaxle. However, in other instances the power conversion circuit is physically separated from the transaxle, and the two are electrically coupled by a high voltage cable. In this type of system, proper cable connectivity is essential if the system is to operate as intended. For example, when a vehicle electric drive system includes a three-phase permanent magnet synchronous motor, the cable must be connected so that all three phase currents can flow between the power conversion circuit and the motor. Accordingly, vehicles having a power conversion circuit that is remote from the transaxle typically include some means for detecting an open phase. Traditionally, a mechanical means, such as a physical switch is deployed. For example, a housing can include an integrated interlock switch. When a cable connector is plugged into the housing, the interlock switch status can be changed, for example from open to closed. The change in interlock switch state can then be communicated to a system controller via interlock wires. However, the use of a mechanical switch injects a degree of risk to the system, as mechanical parts can degrade, fail, or otherwise prove unreliable.

To avoid the reliability and cost issues associated with the use of mechanical means, alternative methods for determining cable connectivity have been proposed. By way of example, a solution that compares actual stator currents to estimated stator currents to determine connectivity has been disclosed. However, this method is prone to false alarms when employed during operational modes in which motor torque is small. As a further example, a pulsed current method in which a pulsed current is injected at the d-axis of the motor has been disclosed that can indicate connectivity status during low torque operation without triggering a large number of false alarms. However, this method is plagued with undesirable noise vibration harshness (NVH) problems.

SUMMARY OF INVENTION

Methods and apparatus for electronic determination of high voltage cable connectivity are presented. An example system can include a power conversion unit, an electric machine coupled to the power conversion unit by a high voltage cable, and an HF interlock module configured to determine cable connectivity status. An example system can be deployed in a hybrid electric vehicle to determine the connectivity of a high voltage cable used to couple a power conversion unit with a remote electric machine. In an example embodiment, a system can be configured to superimpose a high frequency signal over a fundamental command voltage, determine a high frequency current component value, and perform a fault detection function using the high frequency current component value. An example system can include a strategy determination module for enabling a fault detection strategy based on motor operational mode or characteristics.

An example HF interlock module can include a voltage injection module configured to inject a high frequency signal component over a fundamental signal, a current component value determination module configured to determine a high frequency current component value, and a fault detection module configured to determine cable connectivity based on the high frequency current component value.

An example method can include injecting a high frequency voltage signal, determining positive and negative sequence component values associated with a high frequency current, and performing a fault detection function using the positive and negative high sequence component values. An example method can include enabling an HF strategy when one or more predetermined operating conditions are satisfied, and can further include disabling said HF strategy when predetermined conditions are not satisfied.

DETAILED DESCRIPTION OF EXAMPLE EMBODIMENTS

As required, example embodiments of the present invention are disclosed. The various embodiments are meant to be non-limiting examples of various ways of implementing the invention and it will be understood that the invention may be embodied in alternative forms. The present invention will be described more fully hereinafter with reference to the accompanying drawings in which like numerals represent like elements throughout the several figures, and in which example embodiments are shown. The figures are not necessarily to scale and some features may be exaggerated or minimized to show details of particular elements, while related elements may have been eliminated to prevent obscuring novel aspects. The specific structural and functional details disclosed herein should not be interpreted as limiting, but merely as a basis for the claims and as a representative basis for teaching one skilled in the art to variously employ the present invention. For example, while the exemplary embodiments are discussed in the context of a vehicle, it will be understood that the present invention is not limited to that particular arrangement. Likewise functions discussed in the context of being performed at a particular module or device may be performed or combined by a different module or device without departing from the scope of the claims.

Figure 1:
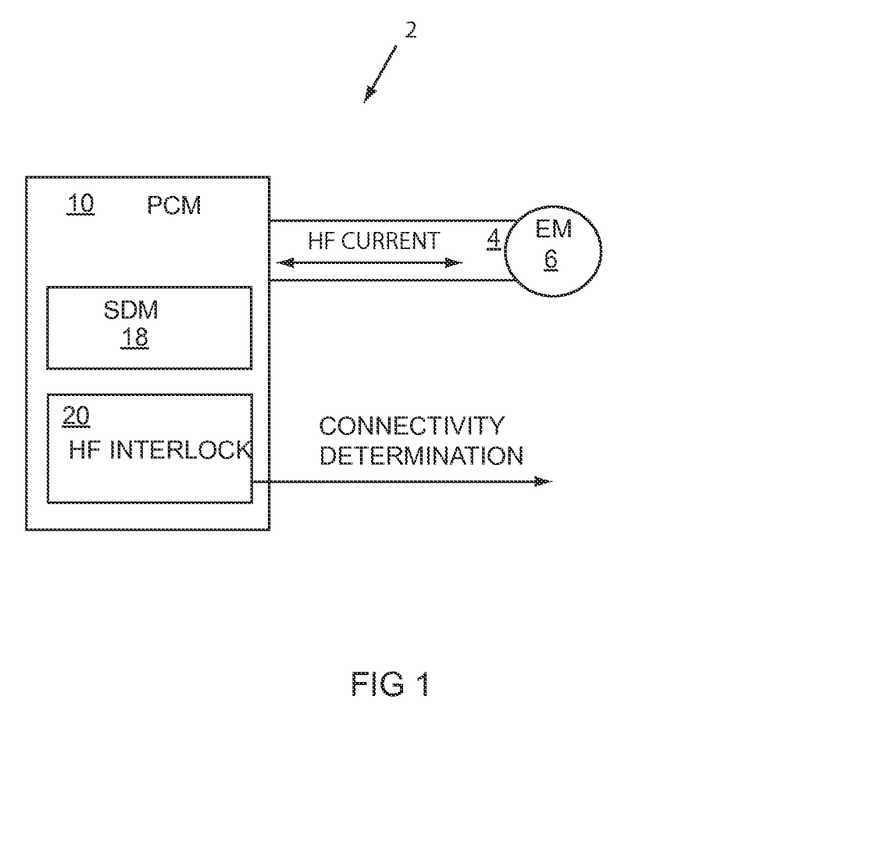
FIG. 1 shows an example system.

Turning now to the several Drawings, FIG. 1 shows an example system 2 in which a high voltage cable 4 is configured to couple an electric machine (EM) 6 to a power conversion unit 10. The high voltage cable 4 can be configured to conduct a three-phase current provided by the power conversion unit 10 to enable operation of the EM 6. In an example embodiment, the EM 6 can be in the form of a permanent magnet synchronous motor (PMSM), for example a PMSM that cooperates with the power conversion unit 10 to provide an electric drive system for a vehicle, such as an electric or hybrid electric vehicle. An example embodiment can include a strategy determination module (SDM) 18 configured to select and enable a fault detection strategy for determining cable 4 connectivity. By way of example, strategy selection can be based on predetermined conditions and current EM 6 operating characteristics. An example system can include an HF interlock module 20 configured to use a high frequency current to determine the connectivity of the high voltage cable 4. The HF interlock module 20 can set a fault flag in response to the detection of one or more open phases. By way of example, in the case in which the power conversion unit 10 and EM 6 form an electric drive system for a vehicle, the fault flag can trigger an electronic control unit or other vehicle control module (not shown) to shutdown vehicle operation.

Figure 2:
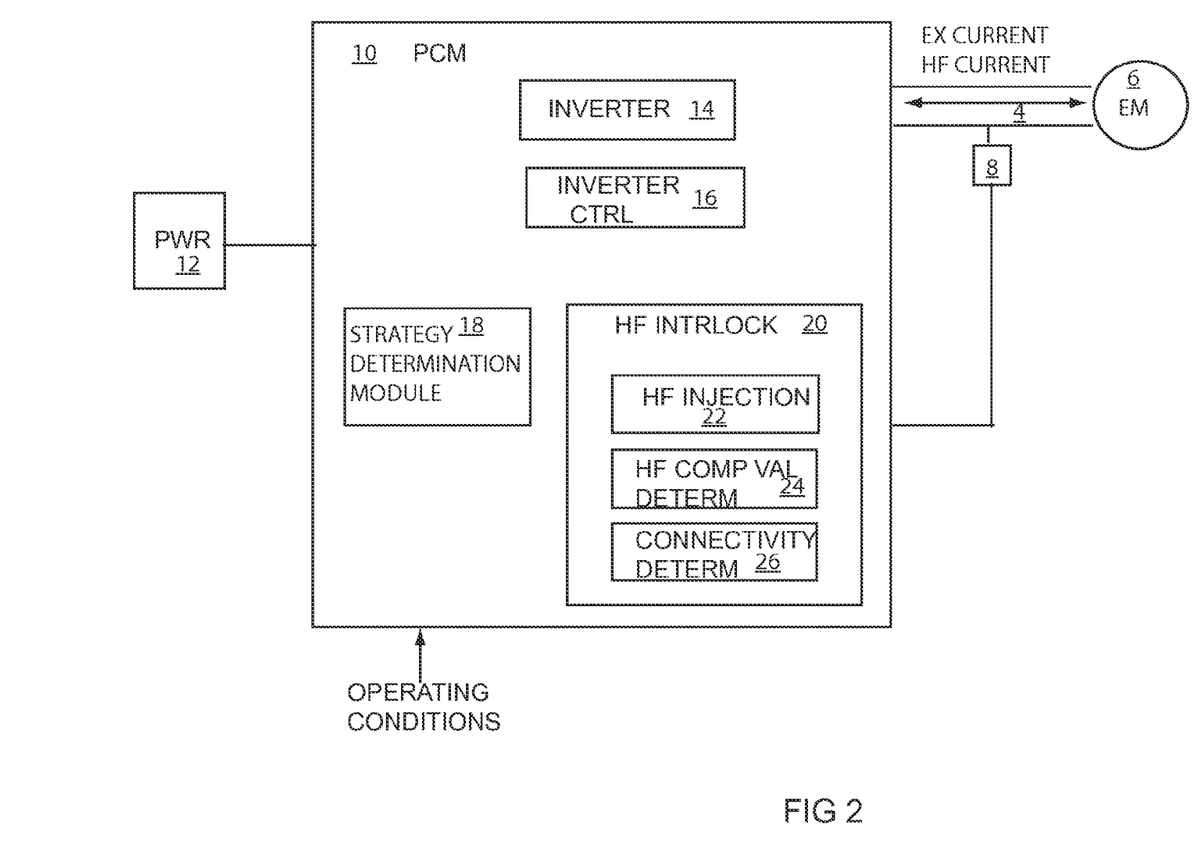
FIG. 2 shows an example system.

Turning to FIG. 2, the example power conversion unit 10 can be coupled to a power source 12. In an example embodiment, the power source 12 can comprise a dc power source such as a high voltage battery. An inverter 14 can be configured to convert DC voltage from the power source 16 to a three-phase alternating current for the EM 6. By way of example, but not limitation, the power conversion unit 10 can include an inverter control 16 configured to provide drive signals for the inverter 14 to produce desired inverter 14 output. The inverter control 16 can include a processing device configured to perform the operations required to determine appropriate drive signals and the hardware, software, firmware required to provide the drive signals to the inverter 14. The inverter 14 can comprise an inverter circuit having power electronics such as insulated gate bipolar transistors (IGBTs) that can be quickly switched on and off by voltage drive signals provided by the inverter control 16 to provide three phase excitation current for the EM 6.

The SDM 18 and HF interlock module 22, which can comprise hardware, software, firmware or some combination thereof, can be integrated with the inverter control 16, embodied as a stand-alone unit, or otherwise configured. In an exemplary embodiment, the SDM 18 and HF interlock module 20 comprise software configured to be executed by a processing device at the power conversion unit 10. In a further example, the SDM 18 and/or HF interlock module 20 can be configured for cooperation with a control function remote from the power conversion unit 10. The example SDM 18 can be configured to select a strategy for determining cable 4 connectivity, so that an optimum strategy can be performed based on EM 6 operational state, minimizing the likelihood of false detections or failures to detect. For example, a strategy can be selected based on current operational parameters such as machine torque and speed. In an example embodiment, the SDM 18 can be activated in a slow loop control algorithm.

In an example embodiment, the HF interlock module 22 can include an HF injection module 22, a component value determination module (CVDM) 24 and a connectivity determination module 26. The example injection module 22 can be configured to inject a high frequency excitation signal that can be provided to the inverter circuit 18, causing it to output a high frequency current in addition to the three phase excitation current for the EM 6. Current within the cable 4 can be sampled by a current sensor 8 and provided to the CVDM 24, configured to detect the high frequency current, and determine high frequency component values. The connection determination module (CDM) 26 can be configured to use the component values to determine the connectivity of the cable 4. For example, the CDM 26 can be configured to determine whether cable connectivity enables the EM 6 can operate normally, or whether one or more open phases exist. In an example embodiment, the CDM 26 can be configured to set a fault flag if it determines that one or more phases are open. In an example embodiment, the HF interlock module 22 can comprise software configured to cooperate with existing power conversion unit hardware and processing capabilities.

Figure 3:
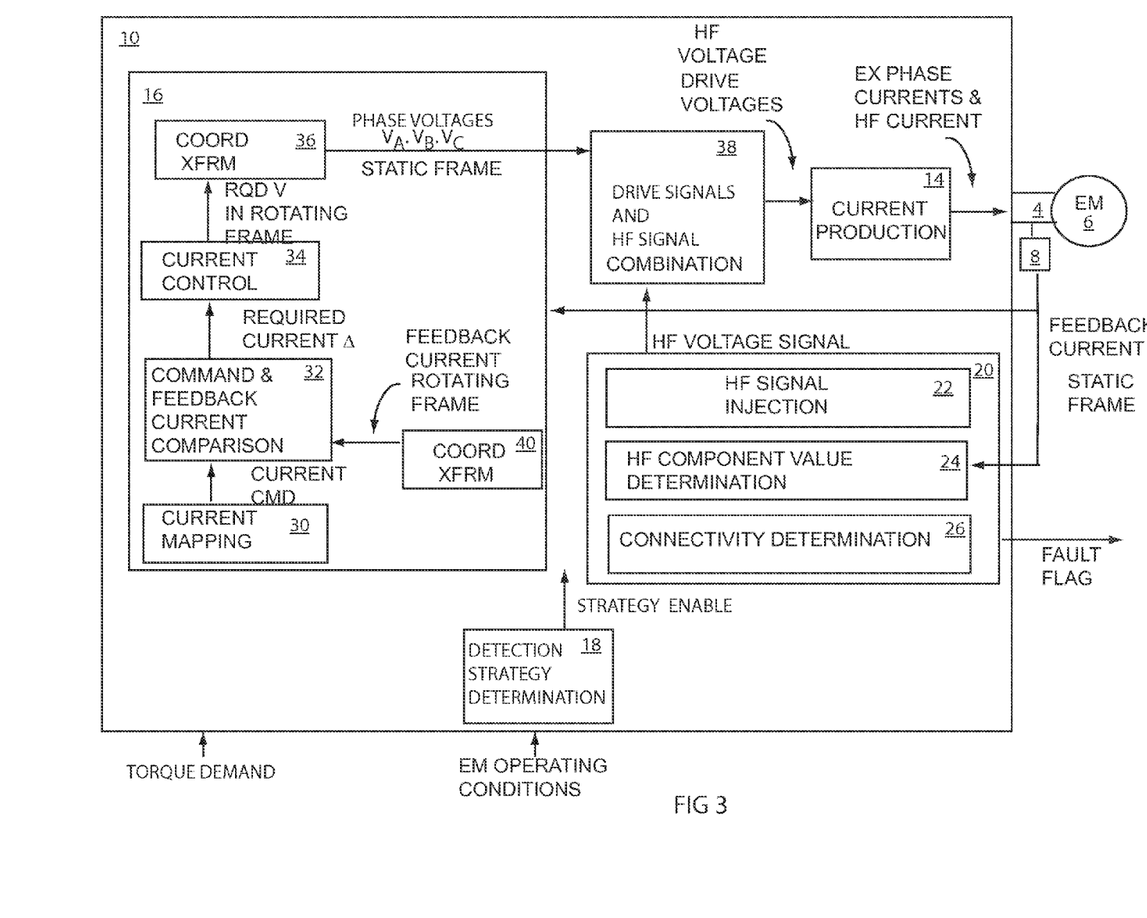
FIG. 3 shows a functional block diagram of an example embodiment.

FIG. 3 shows a functional block diagram of an example system of the invention. A current mapping module 30 can be configured to receive a torque demand for the EM 6. For example, if embodied as part of an electric drive system for an electric or hybrid electric vehicle, the torque demand can be vehicle operational state and desired vehicle speed. The current mapping module 30 can determine the command current required by the EM 6 to satisfy the torque demand, as understood by those skilled in the art.

A comparison module 32 can be configured to compare the command current determined by the current mapping module 32 with the feedback current to determine the change in current required to satisfy torque demand. In an example embodiment, current at the cable 4 is sampled by the sensor 8 to provide a feedback current for the comparison. A CTM 40 can receive feedback current expressed in terms of a static frame and transform it to a rotating frame of reference for current control purposes, for example by Park and Clark transformations as known in the art for field oriented control for an electric motor. The comparison module 32 can provide the required change in current to a current control module 34, which can be configured to determine the voltage signal required to produce the desired inverter output. The required voltage can be provided to a coordinate transform module (CTM) 36 configured to transform the required voltage to a static frame of reference associated with the stator (not shown) of the EM 6. For example, the CTM 36 can be configured to perform inverse Park and Clark transformations. The CTM 36 can be configured to provide three phase voltages, $V_A$, $V_B$, $V_C$ to produce desired phase current output at the inverter 14. In an example embodiment, the drive signals comprise voltage levels and duty cycles that can be applied to gates of various transistors of the inverter 14 to produce the desired current.

Turning to the HF interlock module 20, in an example embodiment, the HF signal injection module 22 can be configured to inject a high frequency voltage signal. The HF injection module 22 can comprise hardware, software, firmware to effect the signal injection. In an example embodiment, the high frequency voltage signal can comprise a voltage level less than or equal to 10V, and a frequency in the range of 500 to 1000 Hz. An HF signal can be superimposed over the phase voltages, $V_A$, $V_B$, $V_C$ at the signal combiner 38, and the combination of signals provided to the inverter 14, which can be configured to output three phase currents and a high frequency current to the EM 6.

The sensor 8 can be configured to provide feedback current to the HF interlock module 20 and the inverter control 16. As stated previously herein, the comparison module 32 can use the feedback current to determine required command current. The HF interlock module 20 can be configured to detect the high frequency current of the feedback current and use its components to determine whether the high voltage cable 4 is properly connected or whether one or more phases are open.

In an example embodiment, the CVDM 24 can be configured to detect the high frequency current and determine its positive and negative sequence components. When a high frequency voltage signal is applied to an electric motor, for example a PMSM, the motor generally behaves as a purely inductive load. When resonance and speed factors are ignored, a simplified expression for the high frequency component can be described by the equations below:

$$\vec{v}^s_{dq} = R_s \vec{i}^s_{dq} + p\left(\sum L_s \vec{i}^s_{dq} - \Delta L_s e^{j2\theta_r} \vec{i}^{s*}_{dq}\right) + \omega_r \lambda_m e^{j\theta_r} \quad (1)$$

$$\sum L_s = \frac{L_q + L_d}{2}, \Delta L_s = \frac{L_q - L_q}{2}$$

where:

$\vec{v}^s_{dq}$ is the stator voltage vector;
$R_s$ is the resistance of a PMSM stator;
$\vec{i}^s_{dq}$ is the stator current vector;
$L_q$ is the stator inductance along a q-axis;
$L_d$ is the stator inductance along a d-axis;
$\theta_r$ is the rotor angular position;
$\omega_r$ is the rotor rotation rate;
$\lambda_m$ is the PM flux linkage.

From (1) it follows that:

$$\vec{v}^s_{dq\_c} \cong p(\Sigma L_s \vec{i}^s_{dq\_c} - \Delta L_s e^{j2\theta_r} \vec{i}^{s*}_{dq\_c}) \quad (2)$$

where:

$\vec{v}^s_{dq\_c}$ is the high frequency stator voltage vector; and
$\vec{i}^s_{dq\_c}$ is the high frequency stator current vector As shown by (3) and (4) below, the high frequency current can include both positive sequence and negative sequence components having amplitudes that are dependent on the applied voltage signal and the PMSM inductance characteristics:

$$\vec{v}^s_{dq\_c} = V_c e^{j\theta c} = V_c(\cos \omega_c t + j \sin \omega_c t) \quad (3)$$

$$\vec{i}^s_{dq\_c} = I_{cp} e^{j(\omega_c t - \frac{\pi}{2})} + I_{cn} e^{j(-\omega_c t + 2\theta_r + \frac{\pi}{2})}$$

$$I_{cp} = \frac{V_c}{\omega_c} \frac{\sum L_s}{\sum L_s^2 - \Delta L_s^2} \quad (4)$$

$$I_{cn} = \frac{V_c}{\omega_c} \frac{\sum L_s^2}{\sum L_s^2 - \Delta L_s^2}$$

where $V_c$ is the amplitude of the high frequency voltage signal;
$\omega_c$ is the angular frequency of the high frequency voltage signal;
$\theta_r$ is the rotor angle position.

The difference between $L_d$ and $L_q$ is referred to as the saliency of the PMSM. As indicated by (3) and (4) above, the negative sequence component $I_{cn}$ is directly related to motor saliency. Furthermore, it can also be seen by that when a PMSM is operating normally, the positive sequence component amplitude $I_{cp}$ is larger than the negative sequence component amplitude $I_{cn}$. Relying on this relationship, a system of the invention can be configured to determine the amplitudes $I_{cp}$ and $I_{cn}$, or component values related to the amplitudes $I_{cp}$ and $I_{cn}$ and use them to determine whether a high voltage cable is properly connected.

Figure 4:
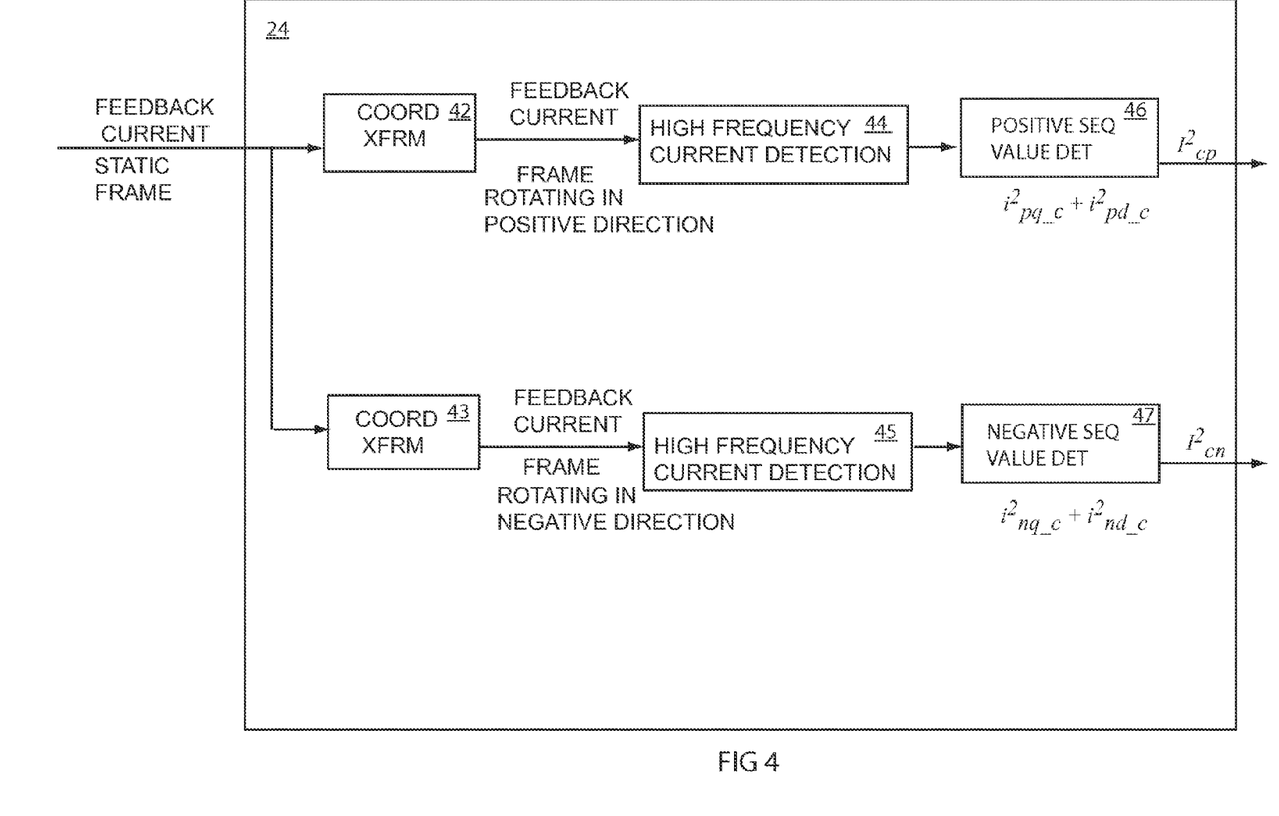
FIG. 4 shows a functional block diagram of an example embodiment.

FIG. 4 shows an example CVDM 24 that can be configured to determine positive and negative sequence component values for a high frequency current. The CVDM 24 can include a first coordinate transformation module (CTM) 42 configured to transform the stator feedback current $\vec{i}^s$ from a static frame to a frame rotating in a positive direction, for example by Park and Clark transformations as known in the art. For example, the CTM 42 can be configured to provide the stator feedback current $\vec{i}^s_{pdq}$ having direct-axis $i^s_{pd}$ and quadrature-axis $i^s_{pq}$ components so that a positive sequence component value can be determined. The CTM 42 output $\vec{i}^s_{pdq}$ can be provided to an HF current detection module 44 that can be configured to detect the high frequency current component of the total feedback current. By way of example, but not limitation, the detection module 44 can be embodied as a low pass filter configured to pass signals having a frequency centered at the HF signal carrier frequency. Thus the detection module 44 can be configured to output a high frequency current $\vec{i}^s_{pdq\_c}$ having a direct component $i^s_{pd\_c}$ and a quadrature component $i^s_{pq\_c}$. The output can be provided to a positive sequence value module (PSVM) 46 configured to determine a value related to the positive sequence component of the high frequency current. In an example embodiment, the PSVM 46 can be configured to add the direct $i^s_{pd\_c}$ and quadrature $i^s_{pq\_c}$ components and take the square root of the sum to obtain the magnitude $I_{cp}$ of the positive sequence component. In a further example embodiment, the PSVM 46 can be configured to determine the value of $(i_{pd\_c}^2 + i_{pq\_c}^2)$ which can be represented by $I_{cp}^2$, to avoid the additional processing required to perform the square root function.

On a parallel track, a CTM 43 can be configured for converting the feedback stator current $\vec{i}_s$ to an $i_{sn}$ with respect to a frame rotating in a negative direction, for example through Park and Clark transformations. Output from the CTM 43 can be provided to an HF current detection module 45 that can be configured to detect the high frequency current component of the total feedback current. By way of example, but not limitation, the HF current detection module 45 can be embodied as a low pass filter configured to pass signals having a frequency centered at the carrier frequency. The current detection module 45 can be configured to provide a high frequency current $\vec{i}^s_{ndq\_c}$ chaving a direct component $i^s_{nd\_c}$ and a quadrature component $i^s_{nq\_c}$. A negative sequence value module (NSVM) 47 can be configured to provide a value related to the negative sequence component of the high frequency current. In an example embodiment, the NSVM 47 can be configured to provide the magnitude $I_{cn}$ of the negative sequence component. In a further example embodiment, the NSVM 48 can be configured to determine the value of $I_{cn}^2$ to avoid the processing required to perform the square root function.

Referring back to FIG. 3, a connectivity determination module (CDM) 26 can be configured to receive the positive sequence and negative sequence values and use them to determine whether an open phase exists at the cable 4. In an example embodiment, the CDM 26 can be configured to add and/or subtract the values and compare the sums and differences to predetermined thresholds to determine whether one or more current phases are open. In an exemplary embodiment, the CDM 26 can comprise software configured for execution at a processor at the inverter control module 18 to perform these determinations.

In some embodiments and applications, overall system performance can be optimized by selectively performing a high frequency detection strategy under predetermined conditions. For example, a high frequency detection strategy can be performed at predetermined times or during predetermined operational modes, such as, but not limited to, after an ignition key is turned but prior to starting a motor, and/or when a motor is functioning under one or more predetermined operating conditions. When predetermined conditions are not satisfied, an alternate detection strategy can be employed. In an example embodiment, the SDM 18 can be configured to determine whether a high frequency detection strategy is to be implemented. For example, the SDM 18 can comprise software executed by a slow loop control scheduler at the inverter control 16.

Figure 5:
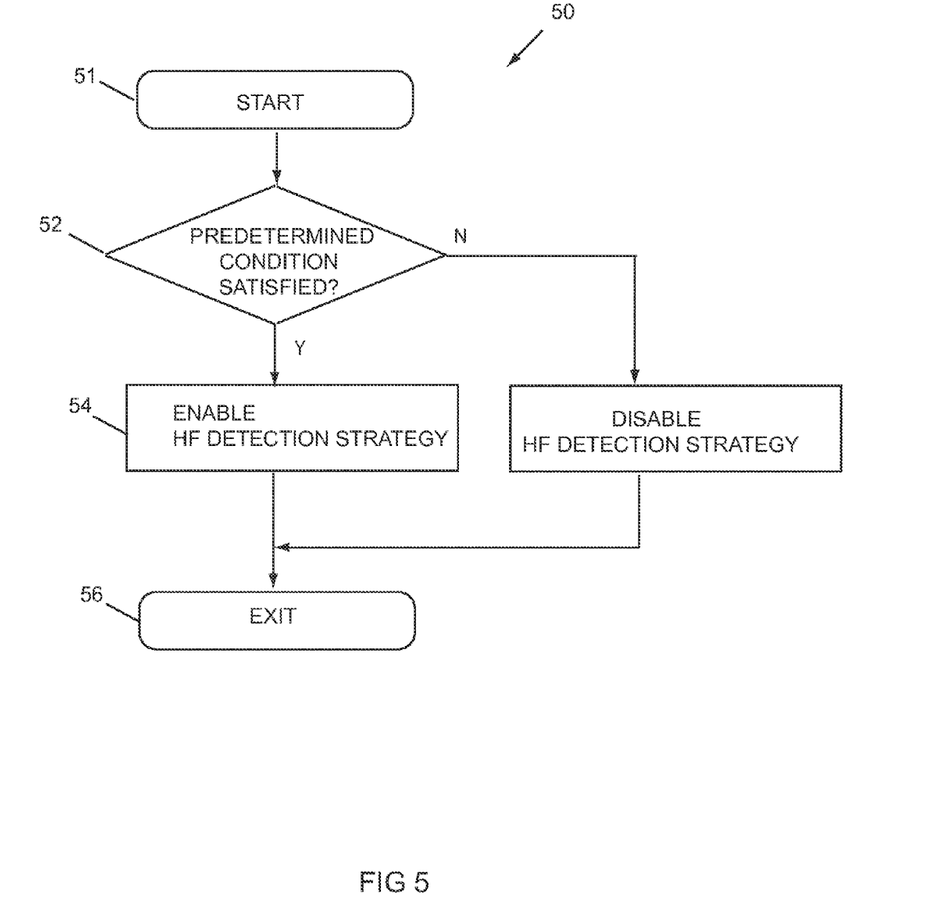
FIG. 5 shows an example method.
Figure 6:
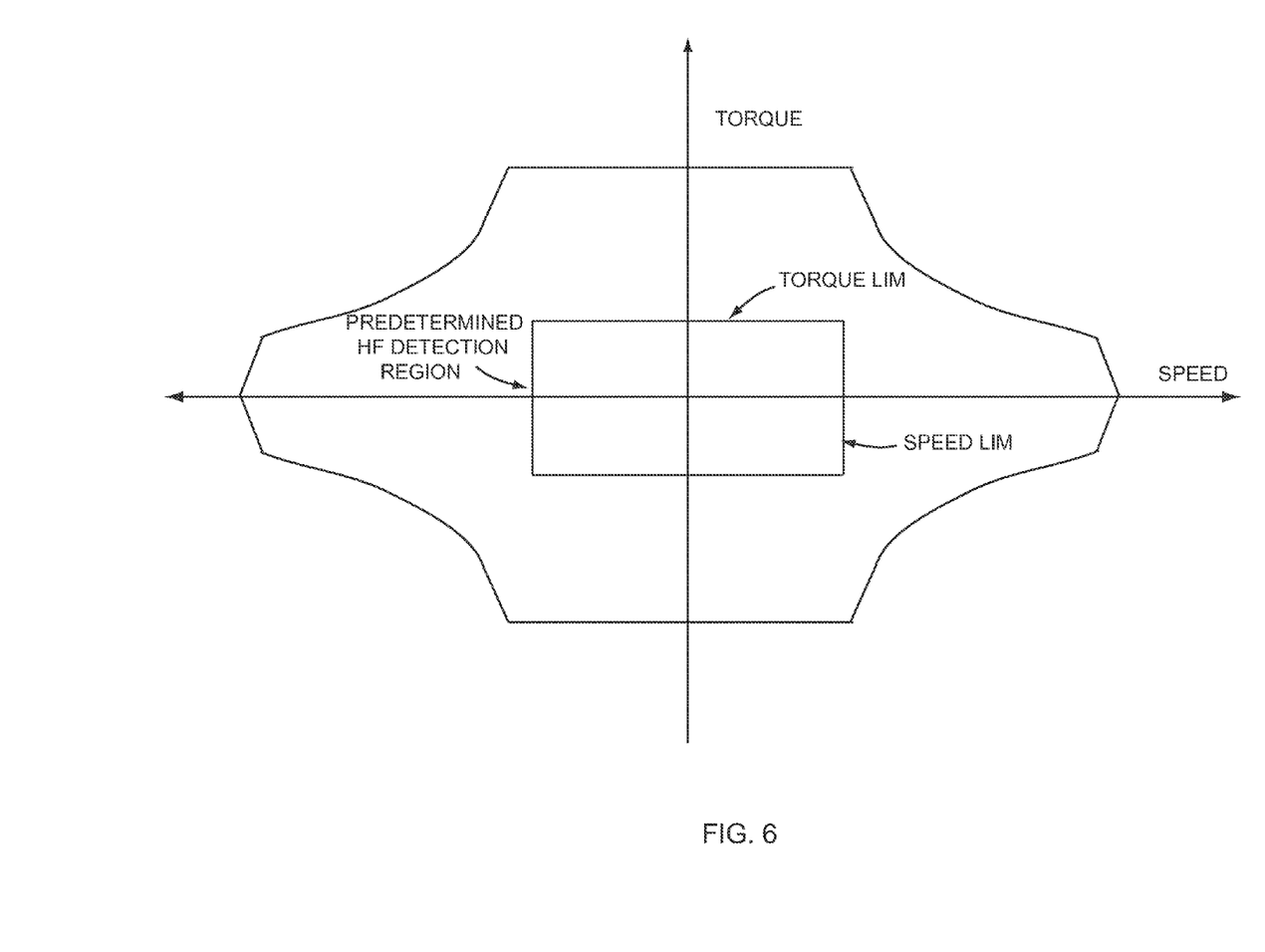
FIG. 6 shows an example operating region for an example system.

FIG. 5 shows an example method 50 of the invention. At block 51 a scheduler slow loop can begin. At decision block 52, a determination can be made as to whether one or more predetermined conditions for enablement of an HF detection strategy are satisfied. For example, a method of the invention can include enablement of a HF strategy only within a predetermined operating region, such as that depicted in FIG. 6, in which the predetermined operating region is defined by torque and speed limitations, TORQUE_LIM and SPEED_LIM. In an example embodiment, an HF detection strategy can be implemented when torque is less than 20 N.m. and speed is less than 3,000 rpm.

Figure 7:
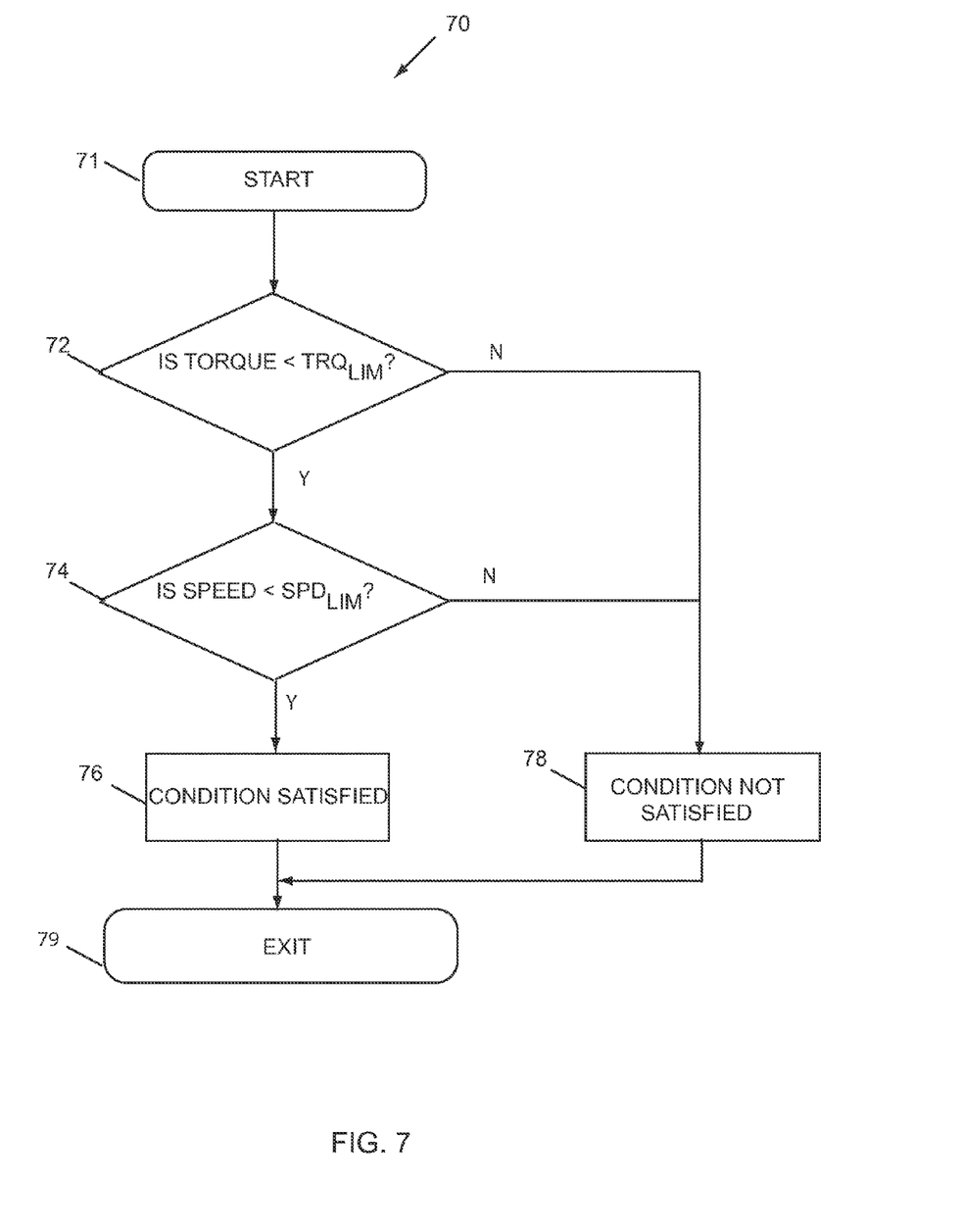
FIG. 7 shows an example method.

FIG. 7 shows an example method 70 that can be used to make this determination. At block 72 a determination can be made as to whether torque at an electric machine is within a predetermined range. In an example embodiment, measured EM 6 torque can be received the SDM 18, which can compare the torque to a predetermined threshold. If the torque exceeds the predetermined threshold, a determination can be made at block 74 that the condition for implementation of the HF detection strategy is not satisfied, and the method can conclude with an exit at block 79. However, if the EM 6 torque is within than the predetermined limitation, the method can proceed to decision block 76 at which a determination can be made as to whether machine speed is within a predetermined range, for example whether the EM 6 speed is less than a predetermined threshold. If so, a determination can be made at block 78 that the requisite condition(s) for HV detection strategy implementation have been satisfied. Otherwise the method 70 can end at block 79 with the determination that requisite predetermined conditions have not been satisfied.

Referring back to FIG. 5, if the predetermined conditions are satisfied, an HF detection strategy can be enabled at block 54. For example, a logic signal can be set for enablement. If the predetermined conditions are not satisfied, the method 50 can be exited at block 58. An example method can include disabling an HF detection strategy at block 56 when predetermined conditions are not satisfied. In addition, a method of the invention can include enabling a different fault detection strategy when conditions do not warrant performing an HF detection strategy.

Figure 8:
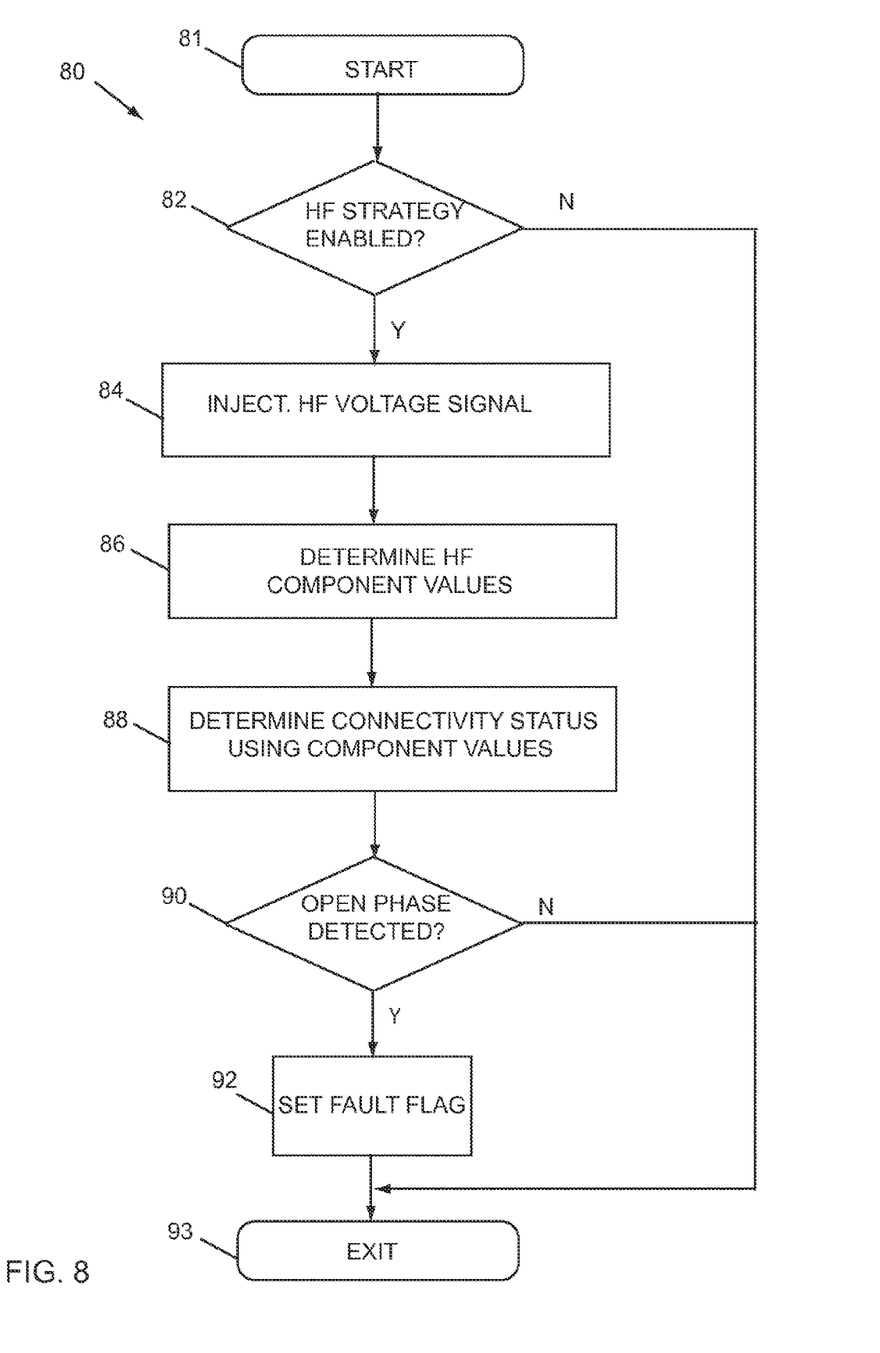
FIG. 8 shows an example method.

FIG. 8 shows a flow diagram of an example method 80. In an example embodiment, the method 80 can be performed in a fast loop along with a current control routine. At block 81 the method 80 can begin. At block 82 a determination can be made as to whether a HF detection strategy is enabled If an HF detection strategy is not enabled, the method 80 can conclude at block 93. If an HF detection strategy is enabled, a high frequency signal can be injected at block 84. For example, the HF signal injection module 22 can effect signal injection. In an example embodiment, an injected signal can have a voltage of less than 10V and a frequency between 500 and 1000 Hz. Output from the signal combiner 38, which can include the high frequency voltage signal superimposed on inverter excitation voltages, can be provided to the inverter 14, which in turn provide current to the EM 6 based on the combined voltages.

At block 86 HF component values can be determined. For example, positive and negative sequence values associated with the high frequency current that results from the HF voltage signal injection can be determined. A sequence value can be based on a sequence component. For example, a positive sequence value can comprise the magnitude of the high frequency current rotating in a positive direction, or can comprise the square of the magnitude of the high frequency current rotating in a positive direction. For example, an $I^2_{cp}$ value can be determined by the PSVM 46 and an $I^2_{cn}$ value can be determined by the NSCM 47.

Figure 9:
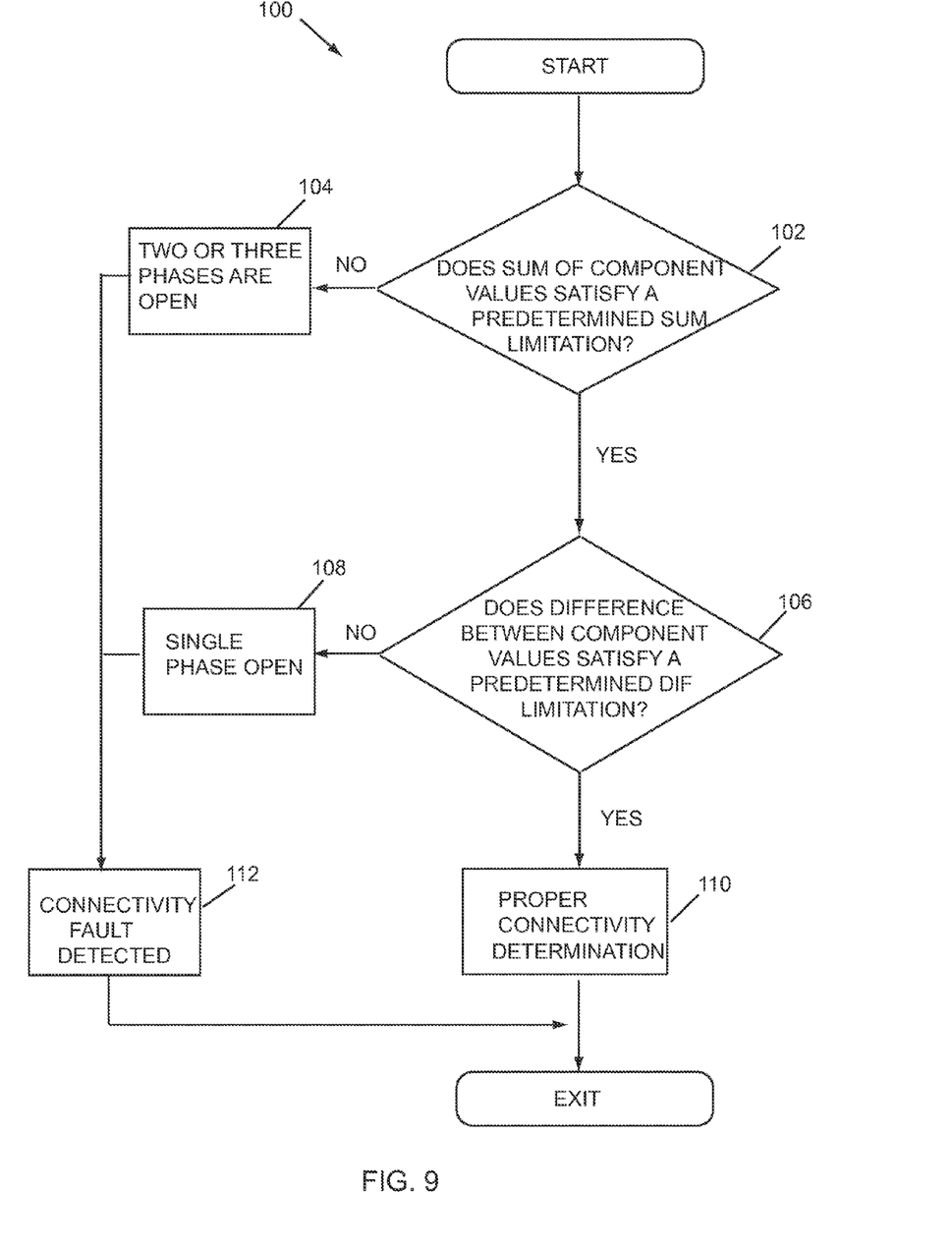
FIG. 9 shows an example method.

At block 88 the positive and negative sequence component values can be used to determine cable connectivity status. FIG. 9 shows an example method 90 by which the component values can be used to determine the connectivity. At block 92 a determination can be made as to whether the sum of the positive and negative sequence component values exceeds a predetermined threshold. In an example embodiment $I_{cp}^2$ is added to the $I_{cn}^2$ and the sum is compared to a predetermined threshold or limitation. By way of example, but not limitation, the predetermined threshold can be designated so that failure to satisfy it can be an indication that at least two phases are open. For example, if two or more phases are open, very little current is conducted through the cable, so the predetermined threshold can be set at a fairly low value, such as 1 amp. If the total current fails to meet or exceed the predetermined threshold, a determination that at least two phases are open can be made at block 94, and at block 100 a determination can be made that the cable is not properly connected.

If, however, the threshold condition is satisfied, the method 90 can continue to block 96 where a determination can be made as to whether the difference between component values satisfies a predetermined difference limitation. In an example embodiment, a predetermined difference limitation can be designated so that a determination can be made as to whether all three phases are present or whether a single phase is open. When one phase is open, current will flow through the remaining two phases. Under this condition, an electric machine such as a PMSM can be modeled by a first order dynamic system, in which the phase A is assumed to be open and the equations below are satisfied.

$$L(\theta_r)\frac{d}{dt}i_b = -(R_s + 2\omega_r \Delta L_s \sin 2\theta_r)i_b + \omega_r \lambda_m \sin \theta_r - \frac{v_{BC}}{\sqrt{3}} \quad (5)$$

$$L(\theta_r) = \sum L_s - \Delta L_s \cos 2\theta_r$$

where $i_b$=phase B current
$v_{BC}$=excitation voltage

From (5) above it can be seen that stator current is dependent on excitation voltage and rotor position, which can lead to a significant nonlinearity. However, if speed and resistance are ignored, the following simplified expression can be obtained for the high frequency signal:

$$L(\theta_r)\frac{d}{dt}i_b \cong V_c \sin \omega_c t \quad (6)$$

From (6) it can be concluded that when a single phase is open, a pulsating signal is applied to the electric machine. The resulting high frequency current can include positive and negative sequence components as shown by (7) below.

$$i^s_{dq\_c} = I_{cp}e^{j\omega_c t} - I_{cn}e^{-j\omega_c t} \quad (7)$$

When a single phase is open the positive sequence components have an amplitude equal to that of the negative sequence components in accordance with the expression below:

$$I_{cp} = I_{cn} = F(\omega_r, \omega_c, V_c) \quad (8)$$

If the positive and negative sequence component amplitudes are generally about the same, then the difference between them is relatively small. In an example embodiment, a determination can be made as to whether the difference $(I_{cp}^2-I_{cn}^2)$ indicates that the component values are generally equivalent. For example, if the difference is less than or equal to a predetermined limitation, it can be concluded that the component values are generally the same, leading to the determination at block 96 that a single phase is open, and at block 100 that a fault is detected. However, if the difference between the positive and negative sequence values exceeds the predetermined limitation, it can be determined that all three phases are present at the cable and the cable is properly connected at block 102. It has been found that when all three phases are present the difference $(I_{cp}^2-I_{cn}^2)$ is on the order of a few amps, which is a relatively large number.

Referring back to FIG. 8, at block 90 a determination can be made as to whether a fault was detected at block 88. When no fault is present, the method can terminate at block 93. When it is determined that an open phase exists, a fault flag can be set at block 92. In an example embodiment, the detection of a fault flag by a diagnostics routine can cause a system shutdown. For example, when a system of the invention is deployed in an electric or hybrid electric vehicle, a vehicle diagnostics module can be configured to detect the fault flag and shut down operation of the electric drive system of the vehicle, for example by opening contacts between the power source 19 and the power conversion unit 10. In an example embodiment, a fault flag can indicate whether one phase is open or more than one phase is open to indicate the severity of the connectivity fault.

Thus the present invention provides systems and methods for determining cable connectivity through high frequency signal injection. A high frequency voltage signal can be superimposed over command voltages provided to an inverter circuit. In response, the inverter circuit can produce a high frequency current having positive and negative sequence components that can be determined. Values associated with the components can be used to determine whether one or more open phases exist at a high voltage cable. Detection of at least one open phase can result in a fault flag that can trigger system shutdown.

Systems and methods of the invention can provide effective and economical detection of high voltage cable connectivity with minimum impact on torque control performance. The present invention provides a strategy that performs better in low torque operating regions than prior art methods and systems, without causing adverse affects such as increased NVH. In an example embodiment, the invention can cooperate with existing hardware to offer a software-only solution. An HF detection strategy can detect a single phase open as well as a multi-phase open.

Although the invention has been described with reference to non-limiting example embodiments illustrated in the attached drawings, it is noted that equivalents may be employed and substitutions made herein without departing from the scope of the invention as recited in the appended claims. For example, functions and operations identified as being performed at a particular module may be performed by a stand alone module or integrated within an existing module as known in the art. Further, although an effort has been made to depict systems and apparatus in a manner that emphasizes novel features of the invention, it is understood that a method of the invention can be practiced by existing apparatus to the extent possible. For example, elements of a present electric drive system can be used to implement a method of the invention in a way that reduces the need to introduce additional apparatus. For example, coordinate transformation modules employed in the determination of command current can be employed in the determination of high frequency current components, and a signal generator used to provide inverter drive signals can be used to provide a high frequency voltage signal. Existing low-pass filters at a power conversion unit or inverter control can be used for high frequency signal extraction. Using existing hardware to the greatest extent allows the invention to provide a software-only solution that is both effective and economical.

What is claimed:

1. A system, comprising:
   an electric machine;
   a power conversion unit configured to provide excitation current to said electric machine;
   a cable configured to electrically couple said electric machine and said power conversion unit; and
   a high frequency (HF) interlock module configured to provide an HF signal to said power conversion circuit, receive an HF feedback current sensed at said cable, determine a value for components of said received HF feedback current, and determine whether a sum of said component values satisfies a predetermined limitation in order to determine connectivity of said cable.

2. The system of claim 1, wherein said sum comprises a sum of a positive sequence component value of said HF feedback current and a negative sequence component value of said HF feedback current.

3. The system of claim 1, wherein said system is configured to determine that a predetermined condition at said machine is satisfied prior to performing a HF detection strategy that includes said HF signal provision and said HF feedback current component determination.

4. The system of claim 1, wherein said system is configured to set a fault flag configured to trigger interruption of said electric machine operation.

5. A high frequency (HF) interlock module, comprising:
   an HF signal injection module configured to inject an HF voltage signal;
   an HF current component value determination module configured to detect said HF current from an electric machine feedback current;
   a connectivity determination module configured to determine connectivity status of a cable configured for coupling to said electric machine based on a component value associated with said HF current; and
   wherein said connectivity determination module is configured to determine a sum of a positive sequence component value and a negative sequence component value associated with said HF current.

6. The system of claim 5, wherein said connectivity determination module is configured to compare said sum to a predetermined limitation.

7. The system of claim 5, wherein said connectivity determination module is configured to determine the difference between said positive sequence component value and said negative sequence component value associated.

8. The system of claim 7, wherein said connectivity determination module is configured to compare said difference to a predetermined limitation.

9. A method, comprising:
   determining whether a predetermined electric machine operating condition is satisfied; and
   enabling a high frequency (HF) detection strategy in response to a determination that said predetermined operating condition is satisfied, said HF detection strategy configured to determine connectivity status of a cable configured to couple said electric machine to a power conversion unit;

said HF detection strategy comprising determining whether a sum of components of an HF feedback current sensed at said cable satisfies a predetermined limitation.

10. The method of claim 9, wherein said predetermined condition comprises said electric machine having torque within a predetermined torque range.

11. The method of claim 9, wherein said HF detection strategy comprises injecting an HF voltage signal at said power conversion unit.

12. The method of claim 9, wherein said HF detection strategy comprises determination of component values associated with an HF current.

13. The method of claim 9, wherein further comprising disabling said HF detection strategy in response to a determination that said predetermined operating condition is not satisfied.

14. A method, comprising:
injecting a high frequency excitation signal;
determining a positive sequence component value associated with a high frequency current;
determining a negative sequence component value associated with high frequency current;
using said positive and negative sequence component values to determine cable connectivity; and
wherein said using said positive and negative sequence component values to determine cable connectivity comprises comparing a sum of said positive and negative component values to a predetermined threshold.

15. The method of claim 5, wherein said using said positive and negative sequence component values to determine cable connectivity comprises comparing a difference between said positive and negative component values to a second predetermined threshold.

16. The method of claim 6, wherein said using said positive and negative sequence component values to determine cable connectivity comprises determining that only one phase is open.

17. The method of claim 5, wherein said using said positive and negative sequence component values to determine cable connectivity comprises determining that two or more phases are open.

18. The method of claim 5, further comprising setting a fault flag when at least one open phase is detected.

19. The system of claim 1, wherein said high frequency interlock module comprises:
an HF signal injection module configured to inject said HF signal at an inverter of said power conversion circuit,
an HF current component value determination module configured to detect said HF feedback current from said electric machine feedback current sampled at said cable, and
a connectivity determination module configured to determine connectivity status of said cable based on a component value associated with said HF current.

* * * * *